(12) United States Patent
Audet

(10) Patent No.: US 8,106,348 B2
(45) Date of Patent: Jan. 31, 2012

(54) WAVELENGTH DETECTION BASED ON DEPTH PENETRATION FOR COLOR IMAGE SENSING

(75) Inventor: Yves Audet, Montreal (CA)

(73) Assignee: Polyvalor, Limited Partnership, Montreal (CA)

( * ) Notice: Subject to any disclaimer, the term of this patent is extended or adjusted under 35 U.S.C. 154(b) by 444 days.

(21) Appl. No.: 12/303,324

(22) PCT Filed: Jun. 5, 2007

(86) PCT No.: PCT/CA2007/000997
§ 371 (c)(1),
(2), (4) Date: Dec. 3, 2008

(87) PCT Pub. No.: WO2007/140602
PCT Pub. Date: Dec. 13, 2007

(65) Prior Publication Data
US 2009/0189056 A1    Jul. 30, 2009

Related U.S. Application Data

(60) Provisional application No. 60/811,435, filed on Jun. 7, 2006.

(51) Int. Cl.
*H01L 31/00* (2006.01)
*H01L 27/00* (2006.01)

(52) U.S. Cl. .................................. 250/214.1; 250/208.1
(58) Field of Classification Search .............. 250/208.1, 250/226, 214.1, 214 R; 348/272
See application file for complete search history.

(56) References Cited

U.S. PATENT DOCUMENTS

| | | | |
|---|---|---|---|
| 5,886,353 | A | 3/1999 | Spivey et al. |
| 6,114,739 | A | 9/2000 | Theil et al. |
| 6,587,146 | B1 | 7/2003 | Guidash |
| 6,737,624 | B1 * | 5/2004 | Toma .................... 250/208.1 |
| 2002/0171881 | A1 * | 11/2002 | Merrill et al. ............ 358/513 |
| 2004/0041932 | A1 | 3/2004 | Chao et al. |

FOREIGN PATENT DOCUMENTS

| | | |
|---|---|---|
| EP | 1006585 | 6/2000 |
| EP | 1394858 | 3/2004 |

OTHER PUBLICATIONS

International Search Report (Form PCT/ISA/210), Sep. 18, 2007.

* cited by examiner

*Primary Examiner* — Thanh X Luu
(74) *Attorney, Agent, or Firm* — Norton Rose OR LLP

(57) ABSTRACT

The present invention is based on the principle of depth of penetration of electromagnetic rays. In the case of semiconductor mono-crystalline materials, such as silicon, the depth of penetration of a light ray is proportional to its wavelength. Using this phenomenon, the present invention consists of a pixel having three electrodes that can discriminate between the colors red, green, and blue, and thereby reconstruct a color image.

31 Claims, 6 Drawing Sheets

WAVELENGTH DETECTION BASED ON DEPTH PENETRATION FOR COLOR IMAGE SENSING

CROSS-REFERENCE TO RELATED APPLICATIONS

This application claims priority of U.S. Provisional Patent Application No. 60/811,435 filed on Jun. 7, 2006.

TECHNICAL FIELD

The present invention relates to the field of image sensors for digital cameras, and more specifically, color image sensors.

BACKGROUND OF THE INVENTION

In this day and age, tendencies go towards reducing consumption of paper and other non-reusable materials in order to transmit information. Emails, automatic teller machines (ATMs), and online shopping are just a few examples that demonstrate this. However, certain media are not as easily digitized with a sufficiently acceptable degree of quality.

Photographs are found among these media. While digital cameras are becoming more and more popular, they currently have spatial resolutions of about 1 to 2 Mega Pixels/cm$^2$, which is by far inferior to conventional cameras with photosensitive chemical film (an ISO 100 film corresponds to about 40 Mega Pixels/cm$^2$). This forces professional photographers, and others, to use the traditional cameras and deal with the ensuing inconveniences, such as waiting to develop the films, toxic acid baths, post-digitization using scanners, etc. In addition, within the family of digital imaging devices, the camera is the one that is farthest behind with respect to resolution. In comparison, scanners can have a resolution of 4800×9600 dpi (dot per inch) and printers can reach 4800×2400 dpi, and this on a surface that is 21.6×27.9 cm (8.5 inches×11 inches). These resolutions are about 4500 times higher than that of an image coming from the best digital cameras and scaled to a comparable surface (50×50 dpi).

Therefore, there is a need to improve the resolution available for digital cameras in order to continue in the direction that technology is currently taking us.

SUMMARY

The principle of depth of penetration of electromagnetic rays is herein used to determine the wavelength of incident radiation. In the case of semiconductor mono-crystalline materials, such as silicon, the depth of penetration of a light ray is proportional to its wavelength. The proposed wavelength detector can thus have three electrodes to discriminate between the colors red, green, and blue, each corresponding to a set range of wavelengths, and thereby reconstruct a colored image.

In accordance with a first broad aspect, there is provided a method for detecting wavelengths of electromagnetic radiation using a pixel sensor, the method comprising: providing a plurality of electrodes positioned on a surface of a substrate having a well of one of P-type and N-type doping, the electrodes being of opposite doping type as the well; generating hole-electron pairs at a plurality of depths inside the well by applying the electromagnetic radiation to the surface; separating the hole-electron pairs into holes and electrons and accelerating one of the holes and electrons towards the surface by applying an electric field; deviating one of the accelerated holes and electrons towards the electrodes by applying a magnetic field in a direction perpendicular to the electric field; and collecting, at each one of the electrodes, one of the deviated holes and electrons generated at one of the plurality of depths to detect wavelengths of the electromagnetic radiation.

In accordance with a second broad aspect, there is provided a method for capturing an image using an image sensor comprising: providing a substrate having rows of wells of one of P-type and N-type doping; providing a set of electrodes for each pixel in the image, each set being positioned on a surface of the substrate, above the wells, the electrodes being of an opposite doping type as the wells; exposing the image sensor to electromagnetic radiation in the image to generate hole-electron pairs at a plurality of depths inside the wells; activating the rows of wells to separate the generated hole-electron pairs into holes and electrons, to accelerate the holes and electrons towards the surface, and to deviate one of the accelerated holes and electrons towards the electrodes; for each activated row, collecting, at each one of the electrodes, one of the deviated holes and electrons generated at one of the plurality of depths, and for each activated row, converting the one of deviated and collected holes and electrons forming currents into voltages associated with each pixel in the row, each of the voltages being indicative of the presence of colors in the pixel.

In accordance with a third broad aspect, there is provided a pixel sensor comprising: a silicon substrate having a well of one of P-type and N-type doping; and a plurality of electrodes for collecting one of holes and electrons, each of the electrodes positioned on a surface of the substrate above the well, at an intersecting point between the surface and a trajectory traveled by one of the holes and electrons from a hole-electron pair generated by a given wavelength of incident electromagnetic radiation; an electric field applicator for applying an electric field to separate the hole-electron pair into the holes and electrons, and to accelerate one of the holes and electrons towards the surface; and a magnetic field applicator for applying a magnetic field in a direction perpendicular to the electric field to direct the one of the holes and electrons towards the electrodes.

In accordance with a fourth broad aspect, there is provided a color image sensor comprising: a substrate having rows of wells of one of P-type and N-type doping; a set of electrodes for each pixel in the image, each set being positioned on a surface of the substrate, above the wells, the electrodes being of an opposite doping type as the wells; a row selector connected to each of the rows of wells, for activating each of the rows; and a buffering device connected to each of the electrodes, for collecting currents associated with holes and electrons collected by each one of the electrodes of each activated row, and for converting the currents collected into voltages to indicate the presence of a plurality of colors in the pixel.

BRIEF DESCRIPTION OF THE DRAWINGS

Further features and advantages of the present invention will become apparent from the following detailed description, taken in combination with the appended drawings, in which.

DETAILED DESCRIPTION

The difficulties presently faced by digital cameras with respect to resolution are due mainly to two factors: the size of microelectronic components and the method used to detect the wavelengths of the incident radiation or the colors.

While the size of transistors has continued to decrease since the introduction of integrated circuits in the 60's, we are still far from having molecular sized transistors. The photosensitive element of a photosensitive chemical film, the pixel, is approximately one order of magnitude smaller than a pixel of a digital camera. Digital imaging uses mostly two types of microelectronic devices in order to transform light (electromagnetic radiation) into an electrical signal: CCD (charge coupled device) sensors and photodiodes.

Figure 1A:
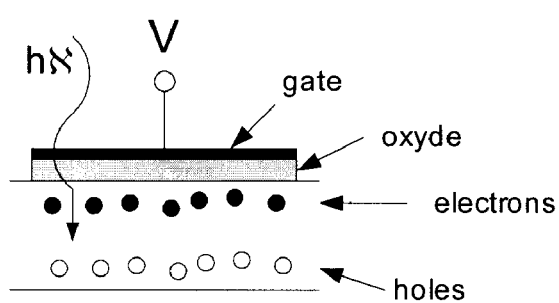
FIG. 1a is a schematic illustrating a CCD pixel as per the prior art.

CCD sensors are actually MOS (Metal Oxide Semiconductor) capacitors fabricated on a silicon substrate (FIG. 1a). An electric potential is applied to the top electrode and produces a potential well under the oxide in order to separate the hole-electron pairs created by the incident photons having an energy $h_v$. An image focalized on a CCD sensor array can be electronically reconstructed. By overlapping the gate electrodes, the accumulated charges are displaced in the substrate and are eventually transformed into voltage by an amplifier located at the bottom of each pixel column. CCD cameras are the most sensitive ones on the market. They are also the most expensive ones since CCD fabrication processes are not widely used for the fabrication of integrated circuits as CMOS fabrication processes. The signal processing electronics must also be placed on another chip in the case of CCD cameras, since it is impossible to make digital circuits from a CCD process, which adds costs to the production of the cameras.

Figure 1B:
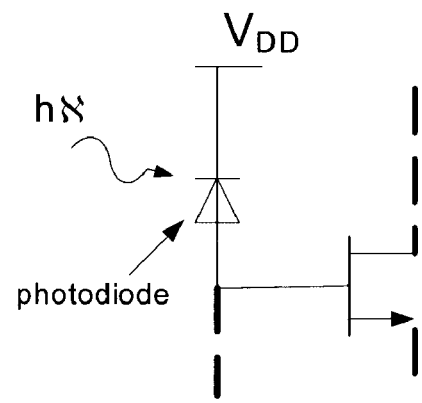
FIG. 1b is a schematic illustrating a photodiode pixel as per the prior art.

Cameras based on photodiodes are fabricated using a CMOS process. A same chip can therefore be used to hold both the pixel array and the signal processing electronics. However, as shown in FIG. 1b, a photodiode pixel must include a transistor as a buffer to avoid charging a large capacitive bus with small photo-generated currents and degrading the small signal with noise generated in the pixel array. In addition, a few more transistors (not shown in figure) are used for resetting and addressing the pixel. These electronic requirements have an impact on the minimum size possible for a pixel, and the photodiode itself must occupy a certain percentage (~50%) of the total surface area of the pixel in order to have a high enough sensitivity. In fact, the sensitivity remains the main limitation to photodiode-based cameras made from a CMOS process. CMOS processes capable of producing transistors with a channel length of 0.25 µm are often used to make the photodiode sensors. The addition of some transistors required by the pixel and the need of a certain size for the photodiode result in a minimum size for the pixel that is similar to that of a CCD pixel.

Figure 2:
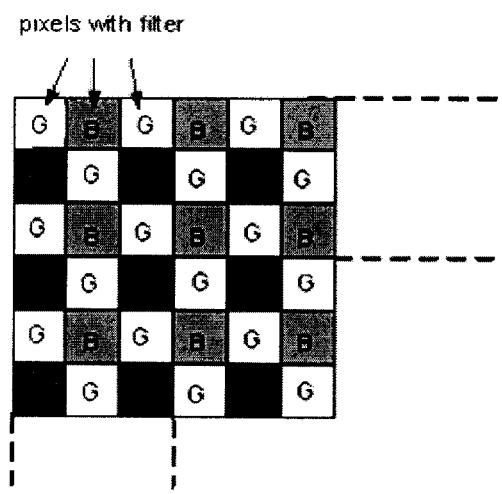
FIG. 2 is a Bayer pattern as used in the prior art.

Neither of the two types of pixels described above can detect color, i.e. the wavelengths of electromagnetic radiation. The only way these types of pixels are sensitive to color is to allow only the desired wavelength through. That is, a pixel will only detect a specific color if it is covered with a filter that only lets through the light ray corresponding to this specific color. Therefore, the pixels in the array act as color and intensity detectors. The most commonly used detection pattern in the video industry is the Bayer pattern, shown in FIG. 2. Here, the pixels that are sensitive to green are used to detect the intensity of the signal (brightness) as well as the color (chrominance) when compared with the signal coming from the blue and the red pixels. A single pixel with a filter cannot provide both brightness and chrominance information on its own. An extrapolating algorithm uses signals from adjacent pixels to do this. The effective resolution of the array which takes into account the quality of the contrasting colors is therefore reduced by a factor of about three with respect to the total number of pixels. Furthermore, the placement of the color filters on top of the pixel array is an additional fabrication step which adds to the costs of production.

Accordingly, a proposed single pixel can detect the three colors from the Bayer pattern without needing a filter, thereby eliminating this costly production step. The present pixel sensor 10 uses the penetration property of electromagnetic rays through solid crystalline. This phenomenon shows that the longer the incident wavelength, the deeper the depth of penetration of the electromagnetic rays inside the pixel. This depth of penetration is characterized by the depth of absorption $\alpha$, which indicates, for a given material and a given wavelength, the depth at which the intensity of the ray incident to the surface of the solid (pixel sensor 10) underwent an attenuation of 1/e (0.368). In the case of mono-crystalline silicon, average blue (470 nm), average green (530 nm), and average red (650 nm) have absorption depths of 0.77, 1.11, and 2.5 µm, respectively.

Figure 3:
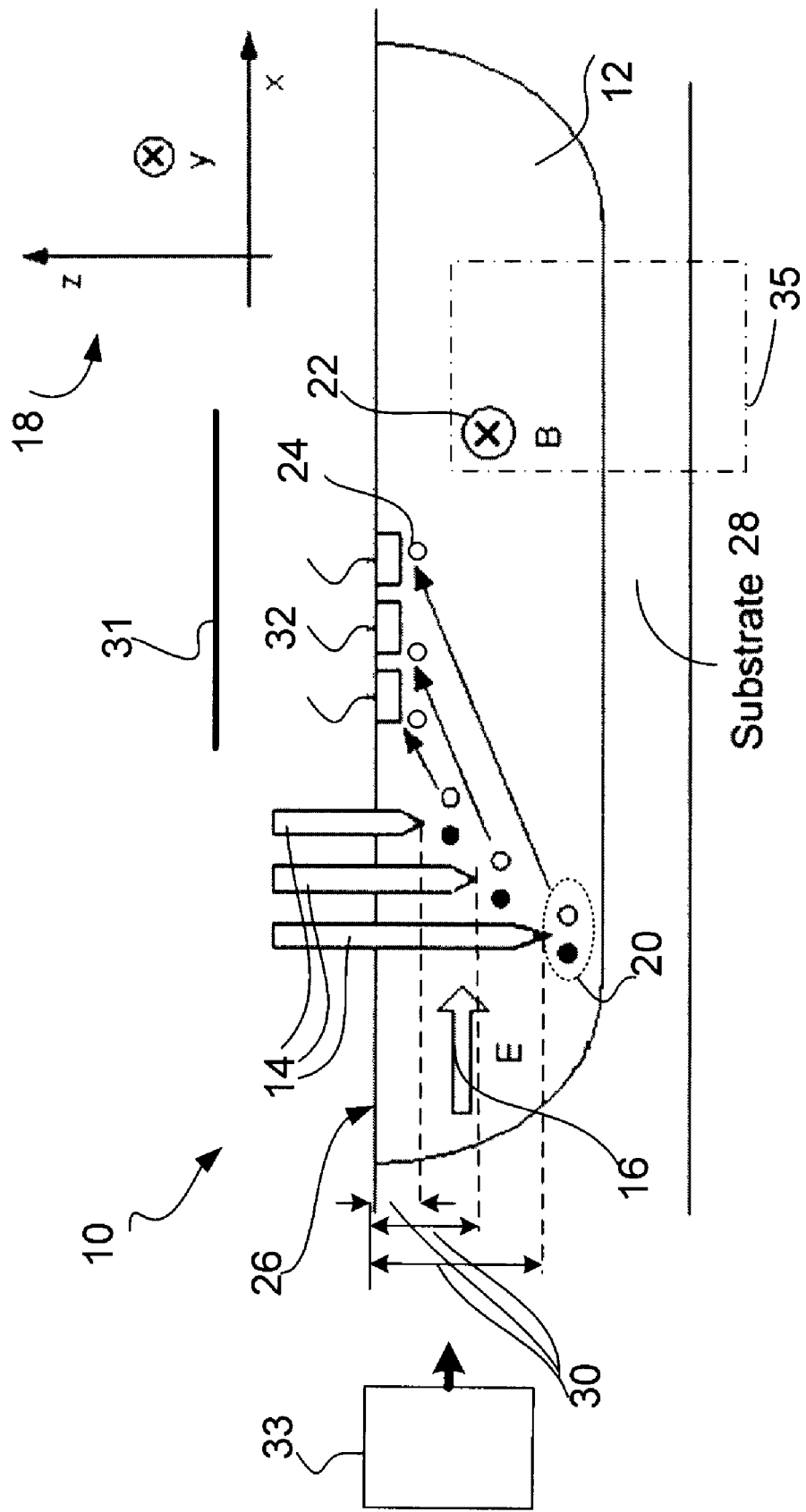
FIG. 3 is a schematic of a pixel sensor with three electrodes in accordance with an embodiment of the present invention.

FIG. 3 illustrates a pixel sensor 10 according to an embodiment wherein an N-doped well (herein referred to as an N-well) 12 is used, and thus wherein pixel charge carriers are holes. Another embodiment using a P-doped well instead of an N-doped well is also possible, wherein the pixel carrier charges are electrons instead of holes.

The electromagnetic rays 14 of different wavelengths penetrate the N-well 12 that is exposed to an electric field E 16 along the x-axis (see reference frame 18). The electron-hole pairs or charge carrier pairs 20 generated at different depths depending on the wavelengths of the incident rays 14, are separated and accelerated by the E field 16. A magnetic field 22 is applied along the y-axis and creates a deviated trajectory for the pixel carrier charges, herein illustrated as holes 24 due to an n-type well 12, such that the holes 24 rise to the surface 26 of the silicon substrate 28, as shown. The point of destination of each hole 24 at the surface 26 along the x-axis is a function of the depth 30 at which the hole originated, and therefore, the wavelength of the incident ray 14 that generated the hole 24. Therefore, three electrodes 32 properly positioned on the surface 26 of the substrate 28 can discriminate between three primary colors for example, or a given combination of wavelengths. For example, blue, green, and red of the Bayer pattern, are discriminated by collecting the currents formed by each of the holes 24 and reaching one of the three color electrodes 32. The electrodes are protected by a protective screen 31 to block any electromagnetic radiation incident on the electrodes 32 which would corrupt wavelength discrimination.

FIG. 3 also illustrates an E-field applicator 33 which can be used to apply the E field 16 in a desired direction. The magnetic field 22 is applied using the magnetic field applicator 35. While the E field is shown as being applied in a direction parallel to the surface, it should be understood that it may also be applied perpendicularly to the surface, or in any direction which causes the carriers to be accelerated in the appropriate direction. Similarly, the B field is applied in any direction which causes the carriers to be deviated towards respective electrodes, perpendicularly to the direction of the E field.

In the case illustrated by FIG. 3, where an n-doped well 12 is formed in the substrate 28, the electrodes 32 are formed using p-type doping (P+) in order to form, with the n-well 12, an inversely polarized diode. This avoids free electrons abundantly found in the n-well 12 from being collected. In this way, only holes 24 generated by the electromagnetic rays are collected.

In order to validate the principle theoretically, a calculation of the current densities of a semiconductor submitted to a magnetic field 22 has been performed. Moving carriers in a magnetic field 22 gives rise to the Lorentz force where the current density is ruled by:

$$\vec{J}_p = \sigma_{pB}[\vec{E} - \mu_p^*(\vec{B} \times \vec{E})] \quad (1)$$

Referring to the N-well scenario of FIG. 3, only the hole density is considered, $\vec{J}_p$. The holes 24 are submitted to a magnetic field 22 in the y direction: $(0, B_y, 0)$; and to the initial electric field 16 in the x direction and the one produced in the z direction due to the Hall effect, together providing the resulting electric field vector: $(E_x, 0, E_z)$.

Under the above conditions, and from equation (1), the hole current density $\vec{J}_p$ can be separated in two components along the x and z directions:

$$J_{px} = \sigma_{pB}[E_x - \mu_p^* B_y E_z] \quad (2\text{-a})$$

$$J_{pz} = \sigma_{pB}[E_z + \mu_p^* B_y E_x] \quad (2\text{-b})$$

where $\mu_p^*$ is the Hall mobility for holes and $\sigma_{pB}$ is given by:

$$\sigma_{pB} = \frac{\sigma_p}{(1 + (\mu_p^* B)^2)} \quad (3)$$

where $\sigma_\pi$ is the hole conductivity.

The same set of current density equations can be written for the electrons, the majority carriers in the N-well 12. However, the electrodes 32 being reverse-biased PN junctions, practically no electrons flow in the z direction, thus:

$$J_{nz} = \sigma_{nB}[E_z - \mu_n^* B_y E_x] = 0 \quad (4)$$

so $E_z$ can now be expressed in term of $E_x$ and $B_y$:

$$E_z = \mu_n^* B_y E_x \quad (5)$$

where $\mu_n^*$ is the Hall mobility of electrons. Equation (5) shows that since electrons are the majority carrier in the N-well 12, they are indeed mainly responsible for the Hall voltage occurrence in the z direction.

Inserting (5) in the set of equations (2), yields the final equations:

$$J_{px} = \sigma_{pB} E_x [1 - \mu_p^* \mu_n^* B_y^2] \quad (6\text{-a})$$

$$J_{pz} = \sigma_{pB} E_x [\mu_n^* B_y + \mu_p^* B_y] \quad (6\text{-b})$$

The deviation of the hole 24 trajectory from its initial direction (along the x axis, following $E_x$) due to the magnetic field 22, $B_y$, can now be calculated from equation 6:

$$\theta_H = \mathrm{arctg}\left(\frac{J_{pz}}{J_{px}}\right) = \mathrm{arctg}\left(\frac{\mu_n^* B_y + \mu_p^* B_y}{1 - \mu_p^* \mu_n^* B_y^2}\right) \quad (7)$$

also known as the Hall angle, $\theta_H$. This angle is dependent only on the strength of the magnetic field 22 and the carrier mobility of a given semiconductor, and is independent of the applied electric field $E_X$ 16. This result implies that the color or wavelength detection principle of the pixel sensor is adaptable to any CMOS processes.

Due to the existing planar processing techniques used in the microelectronic industry, it is impossible to generate an electric field 16 which is perfectly parallel to the substrate surface 26, as shown in FIG. 3. Indeed, any contact, electrode or device added to the substrate 28 has to be positioned at the substrate surface 26. As a result, the electric field 16 can be directed towards the surface 26 where the contact used to apply the voltage producing this field 16 is located. Such a contact is illustrated as electrode 34 in FIG. 4. This technological constraint is an advantage for the sensor since when the E field 16 is applied using such a configuration, the Hall angle required to deviate the pixel carrier trajectory is reduced. Thus, a lower magnetic field strength 22 can be applied according to equation (7).

Figure 4:
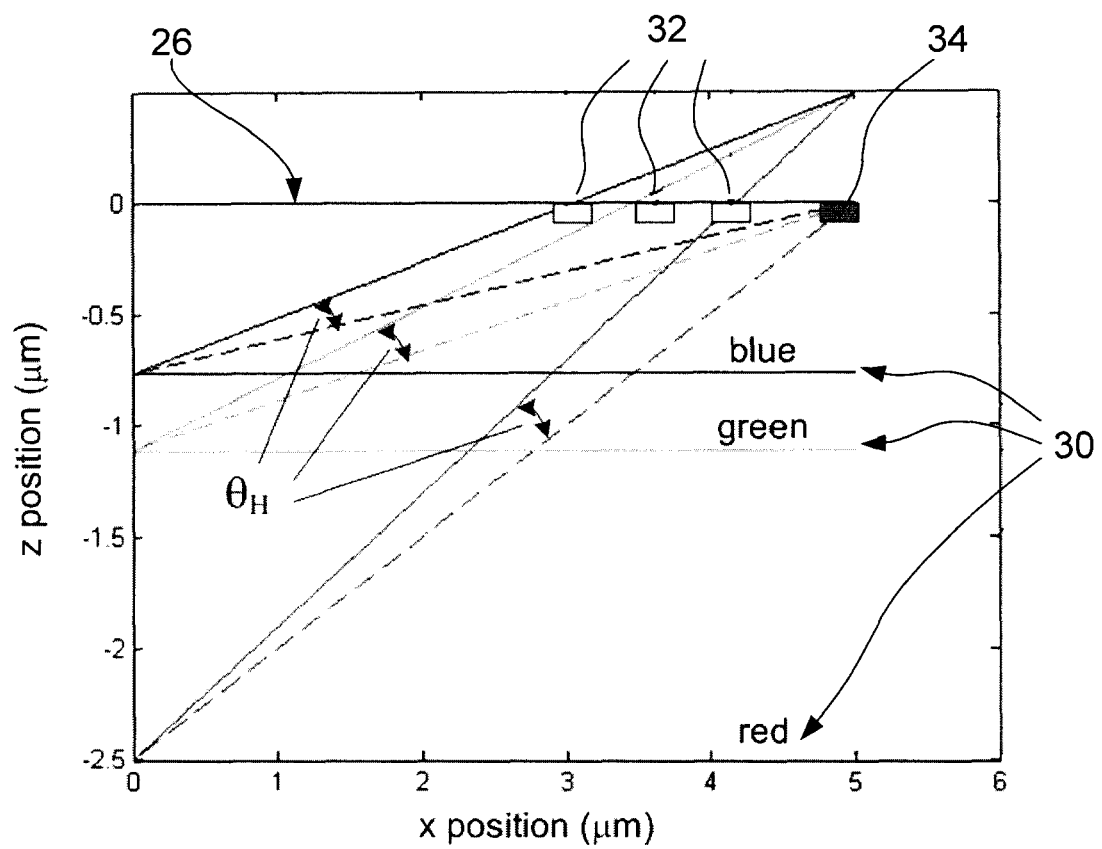
FIG. 4 is a graph illustrating the trajectories of carriers generated at three different depths in a pixel sensor, in accordance with an embodiment of the present invention.

The graph in FIG. 4 illustrates the above statement from Hall angle calculation. Without a magnetic field B (22 in FIG. 3), the trajectories (shown in dashed lines) of the charge carriers (three holes) generated at three different absorption depths 30 associated with the wavelengths of the colors red, green and blue, are converging towards the contact 34 employed to generate the electric field E (16 in FIG. 3).

However, in the presence of a magnetic field B (22 in FIG. 3), the trajectories (shown in solid lines) are deviated by an amount corresponding to the Hall angle, and cross the substrate surface 26 at different positions along the surface 26. The currents generated by the charge carriers (herein illustrated as holes) arriving at the different positions along the surface 26 are collected by the three color detecting electrodes 32.

The graph in FIG. 4 also shows another characteristic of the sensor. Since the magnetic field B (22 in FIG. 3) controls the charge trajectory, it is no longer necessary to have a physical delimitation between two adjacent sensing pixels in order to avoid that charges generated in a sensing pixel A are collected by the electrode of another adjacent sensing pixel B. This phenomenon of auto-confinement of the carriers (herein illustrated as holes) within a single sensing pixel results in the simplification of the masks used during fabrication and increases the spatial resolution of image sensors built using such sensors 10.

Figure 5:
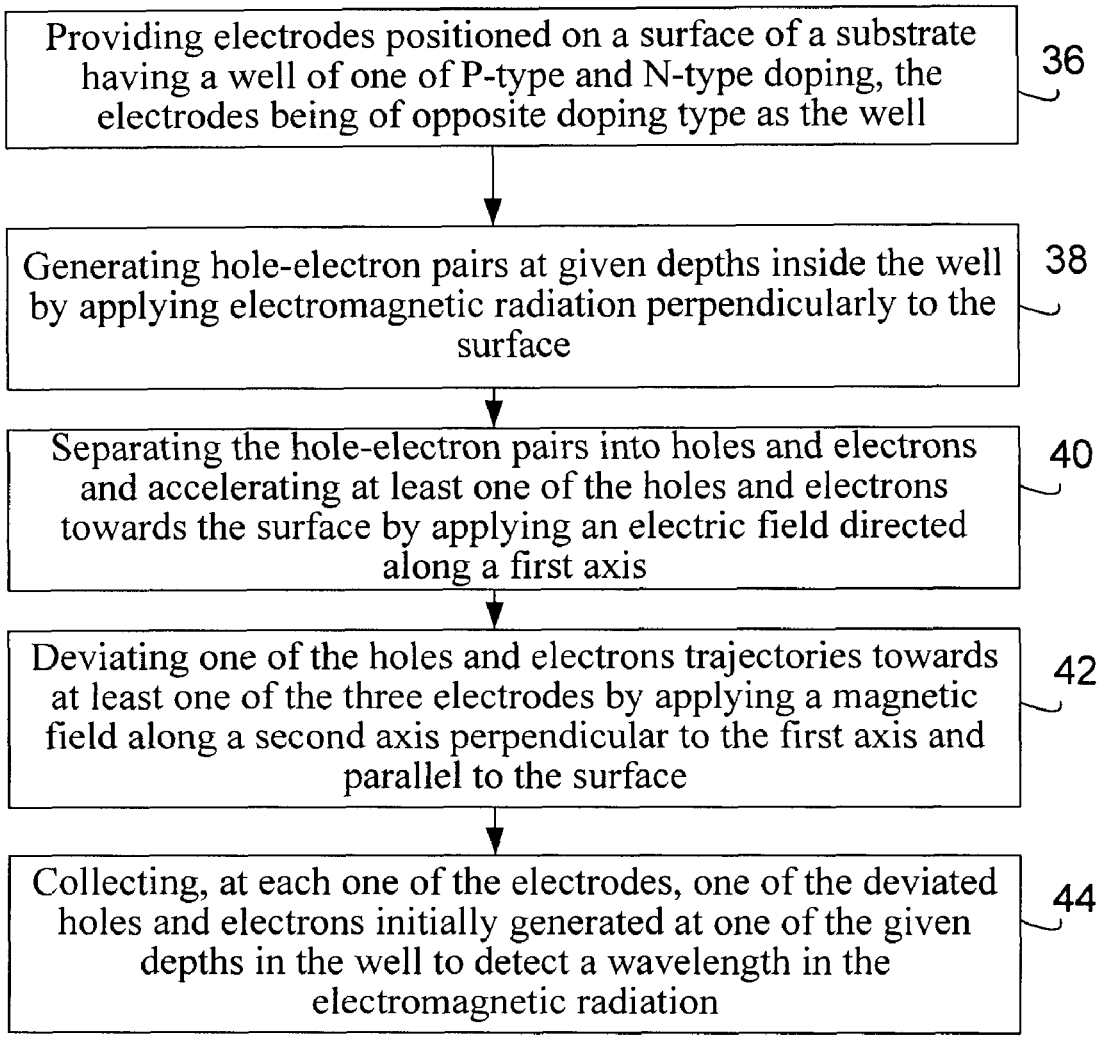
FIG. 5 is a block diagram illustrating a method for detecting incident wavelengths, in accordance with an embodiment of the invention.

FIG. 5 illustrates the method of wavelength or color detection in accordance with an embodiment.

In step 36, there is provided a plurality electrodes 32 positioned on a surface 26 of a substrate 28 having a well 12 of one of P-type and N-type doping. The electrodes 32 are generally preferred to be of an opposite doping type than the well 12. If the three primary colors blue, green and red are to be detected, then three electrodes are used.

In step 38, hole-electron pairs 20 are generated at given locations in the well 12 by applying the electromagnetic radiation 14 on the surface 26 of the substrate and such that the electromagnetic radiation 14 penetrates the well 12. The locations where the hole-electron pairs 20 are generated inside the well 12 depend on the depth of penetration of the wavelengths present in the incident electromagnetic radiation 14.

In step 40, the hole-electron pairs 20 are separated into holes and electrons. The chosen pixel carriers 24 (one of the separated holes and electrons, depending on the well doping type) are also accelerated towards the surface 26. This separation and acceleration is achieved by applying an electric field directed along a first axis with respect to the well 12. A field applicator device can be used to apply the electric field.

In step 42, one of the holes and electrons (or their trajectories towards the surface) are deviated towards at least one of the three electrodes 32 by applying a magnetic field along a second axis perpendicular to the first axis of the electric field. The magnetic field can also be parallel to the surface 26, as illustrated in FIGS. 3 and 4. A field applicator device can also be used to apply the magnetic field in the proper direction.

In step 44, each one of the electrodes collect the pixel carriers 24 (one of the deviated holes and electrons). The pixel carriers collected at one of the three electrodes are thus those generated at one of the given locations in the well 12, and associated with a given wavelength present in the electromagnetic radiation 14.

It is understood that the collected pixel carriers form currents in each of the electrodes. These currents can then be converted into a voltage indicative of the colors present in the incident electromagnetic radiation.

Figure 6:
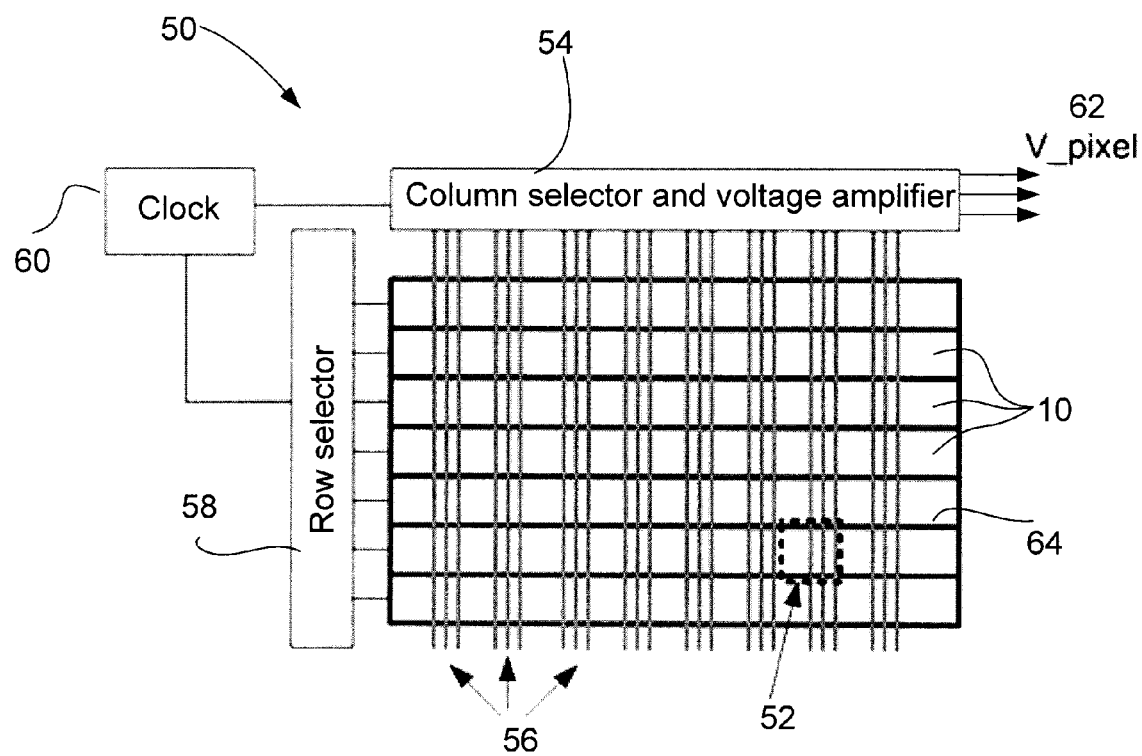
FIG. 6 is a schematic of an image sensor using pixel sensors such as the one in FIG. 3, and in accordance with another embodiment of the present invention.

FIG. 6 is a simplified schematic of an image sensor 50 in accordance with an embodiment. Each row of sensing pixels 52 is formed as a continuous N-well or P-well sensor. Electrode triplets 32 are disposed perpendicularly across the rows and are separated from each other by about a pixel width. The electrodes are PN junctions for N-well sensors (alternatively NP junctions for P-well sensors). The electrodes are placed at the surface of the substrate (well 12) and connected to a buffering device (not shown). The buffering device can take the form of a buffer transistor and be connected in a way similar to the prior art photodiode of FIG. 1b. This buffering device performs the current to voltage conversion needed to propagate the signals throughout columns of pixels.

For example, in the case where the buffering device are buffer transistors, metallic lines 56 connect the source terminals of the buffer transistor of a same column. Such a connection is feasible since a row selector 58 ensures that there is only one N-well (or P-well) sensor 10 (an entire row) activated at any one time, and therefore only one sensing pixel per column active at any one time. A clock 60 synchronizes the column selector and voltage amplifier 54, which further amplifies the voltage collected from the metallic lines 56 into three voltages V_pixel 62 indicative of the colors or wavelengths detected in the pixel. The clock 60 also controls the row selector 58 to ensure that the signals coming from sensing pixels in a same row are processed before moving on to a next row. A database (not shown) may be used to store the resulting pixel voltages.

The present sensor 10 allows image sensors 50 to have resolutions closer to the resolution of conventional chemical films. Its sensitivity can be compared to that of CCD pixels since the volume of silicon per pixel sensitive to light is of the same magnitude. In addition, since the sensor 10 can be fabricated using CMOS technology, the digital reading and signal processing circuitry can be included in the same chip as the pixel array, thereby eliminating the need to add an external circuit as required for a CCD camera.

The width of a sensing pixel 52 is set by the location of the electrodes 32 in a same row. Thanks to the deviated trajectory caused by the magnetic field B 22 (see FIGS. 3 and 4) as explained hereinabove, the overflow of one pixel carrier to another in a same row can be avoided.

However, in order to isolate the rows from one another, an isolator such as a doped strip 64 is added to separate two N-well sensors 10 that are provided side-by-side. Such a strip is available in CMOS technology and its efficiency can be tested to determine the maximum intensity of a light ray 14 that can be detected without affecting the sensors 10 of neighboring rows.

Figure 7:
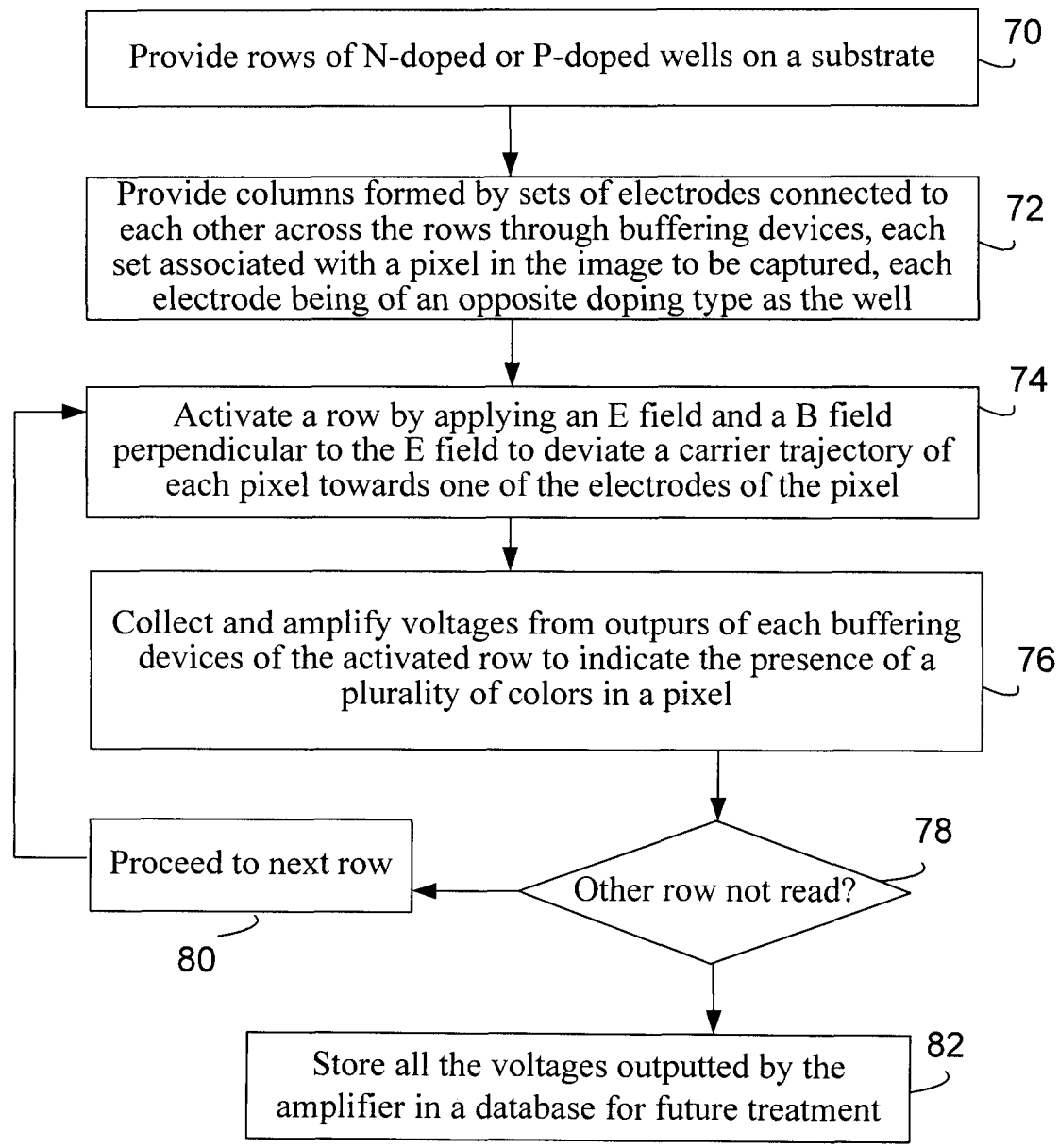
FIG. 7 is a block diagram illustrating a method for capturing an image using an image sensor as in FIG. 6, in accordance with yet another embodiment of the invention.

FIG. 7 illustrates a method for capturing an image using the image sensor 50. It is understood that both the image sensor 50 and the following method can be used to capture any kind of image, a printed image or a real-life caption to create a digital picture, the light of the image being the source of excitation.

In step 70, rows each made of a single sensor 10 formed by a substrate having one of an N-doped or a P-doped well.

In step 72, each row is provided with multiple sets of electrodes doped inversely compared to the well doping type. Each set of electrodes is separated from a neighboring set by a pixel width and each set comprises at least two electrodes. A set from one row is connected to a set of an adjacent row through buffering devices via metallic connectors to form columns of sets of buffering devices connected to each other across the rows.

In step 74, one row formed by a sensor 10 is activated at a given time using a row selector which is connected to each row. The row selector, having field applicators can activate each row by applying an electric field and a magnetic field as detailed hereinabove.

In step 76, charge carriers of each sensing pixel located within an activated row, are collected by the electrodes. Thus, each electrode carry a current associated with the collected charge carriers. A buffering device connected to each electrode provides a current to voltage conversion. A voltage amplifier connected to the columns formed by the outputs of the buffering device further amplifies the voltage from each buffering device. The resulting sets of voltages 62 correspond to each pixel's color definition.

In steps 78 and 80, if other rows are left to be activated and read, the method proceeds to activate a next row and thus repeats steps 74-76. This is done until all the rows have been activated such that an entire surface area containing an array of pixels is captured.

In step 82, all the voltages outputted by the amplifier and corresponding to a color definition for each pixel in the image are stored in a database for future treatment. Future treatment can be, for example, display on screen, printing, any kind of post-treatment such as graphical editing with appropriate software, etc.

It can be appreciated that while the above description teaches N-wells 12, as stated earlier, P-wells can also be used with similar results. In the case of P-wells, the PN junction that forms the electrode is inversed, since the P in the P-well becomes the P of the PN junction.

It should also be noted that alternative materials can be used instead of silicon is Gallium Arsenide (GaAs) as a substrate 28. Such materials include Indium Phosphide (InP), Silicon Germanium (SiGe) and any other semiconductor substrates used to fabricate devices or circuits. However, an image sensor 50 would be more expensive to fabricate on a GaAs substrate than on a silicon substrate. Any other alternative material that is sensitive to visible wavelengths may also be used.

The embodiments of the invention described above are intended to be exemplary only. The scope of the invention is therefore intended to be limited solely by the scope of the appended claims.

I claim:

1. A method for detecting wavelengths of electromagnetic radiation using a pixel sensor, the method comprising:
   providing a plurality of electrodes positioned on a surface of a substrate having a well of one of P-type and N-type doping, the electrodes being of opposite doping type as the well;
   generating hole-electron pairs at a plurality of depths inside the well by applying the electromagnetic radiation to the surface;
   separating the hole-electron pairs into holes and electrons and accelerating one of the holes and electrons towards the surface by applying an electric field;
   deviating one of the accelerated holes and electrons towards the electrodes by applying a magnetic field in a direction perpendicular to said electric field; and
   collecting, at each one of the electrodes, one of the deviated holes and electrons generated at one of the plurality of depths to detect wavelengths of the electromagnetic radiation.

2. The method as in claim 1, wherein providing the plurality of electrodes comprises providing three electrodes.

3. The method as in claim 2, wherein collecting comprises using the three electrodes for detecting each one of the wavelengths associated with the colors blue, green and red.

4. The method as in claim 1, wherein said applying an electric field comprises applying an electric field perpendicularly to the surface.

5. The method as in claim 1, wherein said applying an electric field comprises applying an electric field parallel to the surface.

6. The method as in claim 1, further comprising converting said one of the deviated holes and electrons collected at the electrodes into one of a current and a voltage corresponding to a color level.

7. The method as in claim 6, further comprising storing values associated with said one of a current and a voltage in a database accessible by an output device.

8. A method for capturing an image using an image sensor comprising:
   providing a substrate having an array of wells of one of P-type and N-type doping;
   providing a set of electrodes for each pixel in said image, each set being positioned along the surface of the substrate, above one of said wells, said electrodes being of an opposite doping type as the wells;
   exposing said image sensor to electromagnetic radiation in the image to generate hole-electron pairs at a plurality of depths inside the wells;
   activating the array of rows of the array of wells to separate the generated hole-electron pairs into holes and electrons, to accelerate the holes and electrons towards the surface, and to deviate one of the accelerated holes and electrons towards the electrodes, said activating comprising exposing each one of the rows to a magnetic field;
   for each activated row, collecting, at each one of the electrodes, one of the deviated holes and electrons generated at one of the plurality of depths, and
   for each activated row, converting said one of deviated and collected holes and electrons forming currents into voltages associated with each pixel in said row, each of the voltages being indicative of the presence of colors in said pixel.

9. The method as in claim 8, further comprising storing values associated with said voltages in a database accessible by an output device.

10. The method as in claim 9, further comprising using said stored voltages and said output device to display said captured image.

11. The method as in claim 8, wherein said activating comprises exposing the row to an electric field, the a magnetic field being applied in a direction perpendicular to said electric field.

12. The method as in claim 8, wherein said exposing, activating, collecting and converting are performed simultaneously for each one of the rows using a clocked cycle.

13. The method as in claim 8, wherein providing a set of electrodes comprises providing a triplet of electrodes for each pixel in said image, to capture at least three colors in said pixel.

14. The method as in claim 13, wherein providing a triplet of electrodes for each pixel in said image comprises providing three electrodes, each for collecting one of holes and electrons generated from one of blue, green and red electromagnetic radiation.

15. The method as in claim 8, further comprising connecting each of said electrodes with electrodes placed above and below, in a previous and in a subsequent row.

16. A pixel sensor comprising:
   a silicon substrate having a well of one of P-type and N-type doping; and
   a plurality of electrodes for collecting one of holes and electrons, each of said electrodes positioned on a surface of said substrate above said well, at an intersecting point between said surface and a trajectory traveled by one of said holes and electrons from a hole-electron pair generated by a given wavelength of incident electromagnetic radiation;
   an electric field applicator for applying an electric field to separate said hole-electron pair into said holes and electrons, and to accelerate one of said holes and electrons towards the surface; and
   a magnetic field applicator for applying a magnetic field in a direction perpendicular to said electric field to direct said one of said holes and electrons towards said electrodes.

17. The pixel sensor as in claim 16, wherein the plurality of electrodes comprises three electrodes.

18. The pixel sensor as in claim 17, wherein the three electrodes are used to detect colors blue, green and red.

19. The pixel sensor as in claim 17, wherein said electric field applicator comprises an applicator for applying said electric field perpendicularly to the surface.

20. The pixel sensor as in claim 17, wherein said electric field applicator comprises an applicator for applying said electric field parallel to the surface.

21. The pixel sensor as in claim 17, further comprising an amplifier connected to said electrodes for converting currents associated with said one of said holes and electrons collected by the electrodes into a voltage corresponding to a pixel's color definition.

22. The pixel sensor as in claim 21, further comprising a database accessible by an output device, for storing values associated with said currents and said voltage.

23. A color image sensor comprising:
- a substrate having an array of adjacent wells of one of P-type and N-type doping;
- a set of electrodes for each pixel in said image, each set being positioned along a surface of the substrate, above one of said wells, said electrodes being of an opposite doping type as the wells;
- a row selector connected to each row of the array of wells, for activating each of the rows by exposing each one of the rows to a magnetic field; and
- a buffering device connected to each of said electrodes, for collecting currents associated with holes and electrons collected by each one of the electrodes of each activated row, and for converting said currents collected into voltages to indicate the presence of a plurality of colors in said pixel.

24. The color image sensor as in claim 23, further comprising a voltage amplifier for amplifying the voltages outputted by the buffering device.

25. The color image sensor as in claim 23, wherein said buffering device comprises buffering devices for each pixel, and wherein said buffering devices are connected with buffering devices placed above and below, in a previous and in a subsequent row.

26. The color image sensor as in claim 23, wherein one of said row selector and each of said rows comprises a field applicator for applying an electric field to accelerate and separate hole-electron pairs generated in by a given wavelength of incident electromagnetic radiation into said holes and said electrons, and for applying the magnetic field in a direction perpendicular to said electric field to deviate a trajectory traveled by said one of the holes and electrons towards each one of said electrodes.

27. The color image sensor as in claim 26, wherein said field applicator comprises an electrical contact located on the surface of the substrate.

28. The color image sensor as in claim 24, further comprising a clock for synchronizing said voltage amplifier with said row selector.

29. The color image sensor as in claim 23, wherein the set of electrodes comprises three electrodes for each pixel in said image to capture at least three colors in each pixel.

30. The pixel sensor as in claim 24, further comprising a database connected to said voltage amplifier and accessible by an output device, said database for storing values associated with one of said currents and said voltages for each pixel in said image.

31. The color image sensor as in claim 23, further comprising an isolator for isolating each of said rows from adjacent rows.

* * * * *